(12) United States Patent
Feddeler et al.

(10) Patent No.: US 9,197,231 B1
(45) Date of Patent: Nov. 24, 2015

(54) SYSTEMS AND METHODS FOR DATA CONVERSION

(71) Applicants: James R. Feddeler, Austin, TX (US); Michael T. Berens, Austin, TX (US)

(72) Inventors: James R. Feddeler, Austin, TX (US); Michael T. Berens, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/266,193

(22) Filed: Apr. 30, 2014

(51) Int. Cl.
*H03M 1/12* (2006.01)
*H03M 1/06* (2006.01)
*H03M 1/38* (2006.01)
*H03M 1/40* (2006.01)
*H03M 1/46* (2006.01)

(52) U.S. Cl.
CPC .............. *H03M 1/0675* (2013.01); *H03M 1/12* (2013.01); *H03M 1/38* (2013.01); *H03M 1/40* (2013.01); *H03M 1/46* (2013.01)

(58) Field of Classification Search
CPC ........... H03M 1/38; H03M 1/40; H03M 1/46; H03M 1/0675; H03M 1/12
USPC .................................................. 341/155, 161
See application file for complete search history.

(56) References Cited

U.S. PATENT DOCUMENTS

| | | |
|---|---|---|
| 5,644,308 A | 7/1997 | Kerth et al. |
| 6,351,237 B1 | 2/2002 | Martek et al. |
| 6,424,276 B1 | 7/2002 | Munoz et al. |
| 6,717,542 B2 | 4/2004 | Harada |
| 6,985,098 B2 * | 1/2006 | Lee ................................ 341/120 |
| 7,528,761 B2 | 5/2009 | Draxelmayr |
| 7,609,184 B2 * | 10/2009 | Kuramochi et al. .......... 341/118 |
| 8,525,720 B2 | 9/2013 | Shah |
| 8,836,549 B2 * | 9/2014 | Schell et al. .................. 341/118 |

OTHER PUBLICATIONS

Liu, C., et al., "A 10b 100MS/s 1.13mW SAR ADC with Binary-Scaled Error Compensation", 2010 IEEE International Solid-State Circuits Conference, ISSCC 2010/Session 21/successive-Approximation ADCs/21.5, Feb. 2010, pp. 386-388.

Draxelmayr, D., et al., "A self Calibration Technique for Redundant A/D Converters Providing 16b Accuracy", 1988 IEEE International Solid-State Circuits Conference, ISSCC 88/, Session XIV: Analog Techniques, Feb. 18, 1988, pp. 204-205, and 375.

Boyacigiller, Z.G., et al., "An Error-Correcting 14b/20us CMOS A/D Conferter", 1981 IEEE International Solid-State Circuits Conference, ISSCC B1, Session VI: Acquisition Circuits, Feb. 18, 1981, pp. 62-63.

Liu, W., et al., "A 12b 22.5/45MS/s 3.0mW 0.059mm2 CMOS SAR ADC Achieving Over 90dB SFDR", 2010 IEEE International Solid-State Circuits Conference, ISSCC 2010/Session 21/Successive-Approximation ADCs/21.2, Feb. 2010, pp. 380-382.

Kuttner, F., "A 1.2V 10b 20MSample/s Non-Binary Successive Approximation ADC in 0.13um CMOS", 2002 IEEE International Solid-State Circuits Conference, ISSCC 2002/Session 10/High-Speed ADCs/10.6, 2002, pp. 1-2.

* cited by examiner

*Primary Examiner* — Brian Young

(57) ABSTRACT

Systems and methods for electronically converting an analog signal to a digital signal are disclosed. The systems and methods may include, for a first bit value, setting a first conversion value to include a first offset; using the output of a first comparison, setting a second conversion value; and if the first bit value has a predetermined relationship to the first offset bit value, removing the first offset from the second conversion value, and, using the output of a second comparison, setting a third conversion value.

19 Claims, 5 Drawing Sheets

SYSTEMS AND METHODS FOR DATA CONVERSION

BACKGROUND

1. Field

This disclosure relates generally to electrical circuitry, and more specifically, to electrical circuitry for data conversion.

2. Related Art

Data converters are very useful for converting analog signals to digital signals, and for converting digital signals to analog signals. Many applications require data converters that have a high resolution, fast conversion time, allow a broad range of inputs, and yet are cost effective. Accuracy is also important to data converters, which are susceptible to noise, settling, and other speed and environmentally induced errors. A common technique for eliminating these errors is redundancy, by which the data converter can re-convert to correct errors of certain magnitude. One of the primary benefits of redundancy in a successive approximation data converter is to increase the conversion speed by relaxing the DAC settling time requirements. Other data conversion features may also be important for various applications. It is thus important to be able to provide data converters that meet a wide variety of potentially conflicting criteria, while at the same time have a fast conversion time and remain cost effective

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

A successive approximation analog to digital converter (ADC) includes a digital to analog converter (DAC) with elements that are added sequentially to adjust an input-dependent voltage. The voltage is compared to a reference voltage at each addition and the DAC elements are adjusted based on the comparison result. Upon completion, the comparison results are a digital representation of the analog input voltage. An offset is included in the comparison at one or more predetermined points. The offset is then removed after another set of predetermined points and an extra comparison is performed. The intentional offsets combined with the extra comparisons create a redundancy which relaxes the requirements on both DAC settling time and the comparator accuracy during the portion of the approximation that uses redundancy.

Figure 1:
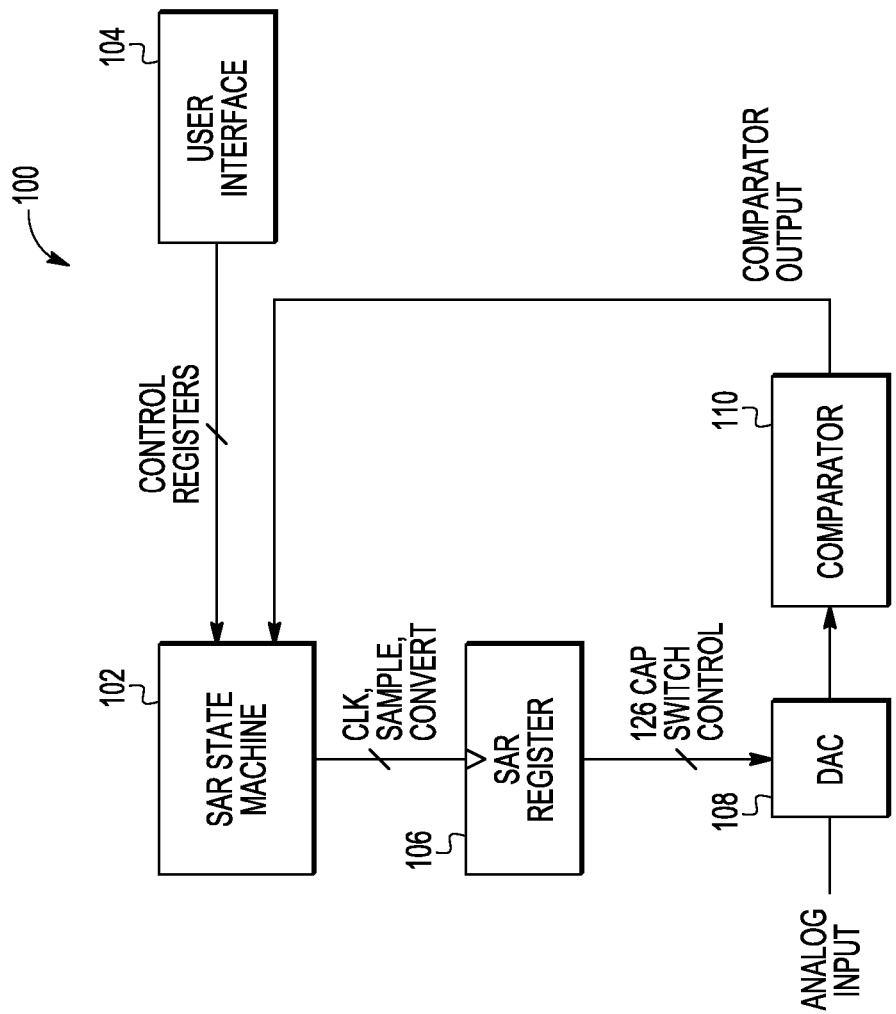
FIG. 1 illustrates, in schematic form, a portion of an analog to digital data converter in accordance with one embodiment.

FIG. 1 illustrates, in schematic form, a portion of an analog to digital data converter 100 in accordance with one embodiment including successive approximation register (SAR) state machine or control circuit 102, user interface 104, SAR register 106, digital to analog converter (DAC) 108 and comparator 110. DAC 108 receives an analog input that is used to set a charge on capacitive elements in DAC 108. Output from DAC 108 is provided to comparator 110, which for a single-ended DAC 108 provides the difference between a reference voltage and the output of DAC 108. For a differential DAC 108, comparator 110 determines the difference between a plus output of DAC 108 and a minus output of DAC 108. The output of comparator is provided to SAR state machine 102.

User interface 104 provides control information to SAR state machine 102 to control operating features such as operational speed, output format, and whether to run an average of the conversion results, among other features. SAR state machine 102 can operate at a fixed or variable clock rate.

SAR state machine 102 controls conversion by placing commands and parameters in SAR registers 106, which are then provided to DAC 108. A conversion will begin when a trigger to convert signal is sent by the SAR state machine 102. When the asserted trigger signal is received, DAC 108 samples an input voltage. In one embodiment, the SAR converter samples for a period indicated by user interface 104. SAR state machine 102 then places DAC 108 into a convert mode and provides an offset value to use during the conversion.

In one embodiment of the convert mode, comparator 110 subsequently compares the DAC output with the intentional offset to a reference voltage. During each comparison, SAR state machine 102 successively sets or clears the corresponding digital output bit based on the compare result. This information gets passed into DAC 108 to adjust the DAC output by fractions of a reference voltage. A particular offset can be used for one or more of the bits of the DAC 108. When the bits associated with an offset have been compared, the offset can be removed and the SAR state machine 102 can specify another offset to use for another one or more of the bits of the DAC 108 or it can specify to remove the offset. At this point, an extra comparison step is performed.

When the SAR converter has made the appropriate number of successive approximations using the offsets, SAR state machine 102 indicates that it is complete and transfers the results to output circuitry. In one embodiment, this output circuitry employs averaging if so configured, and then formats the data in the appropriate manner.

In some embodiments, data converter 100 may be implemented as a semiconductor device as a single integrated circuit, may be implemented as a plurality of integrated circuits, or may be implemented as a combination of integrated circuits and discrete components. Alternate embodiments may implement data converter 100 in any manner.

Figure 2:
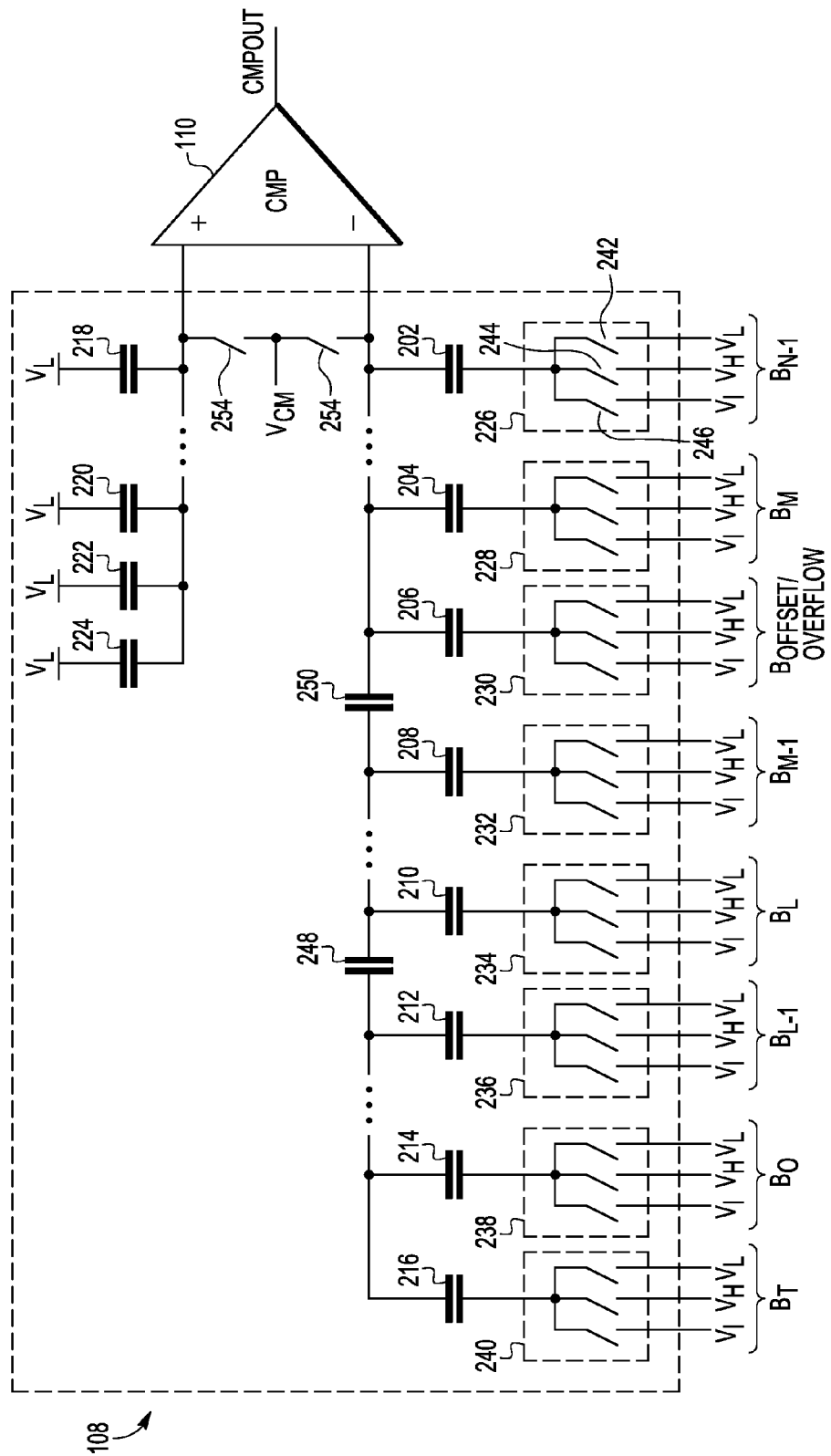
FIG. 2 illustrates, in schematic diagram form, a portion of a single-ended digital to analog converter (DAC) of the data converter of FIG. 1 in accordance with one embodiment.

FIG. 2 illustrates, in schematic diagram form, a portion of a single-ended digital to analog converter (DAC) 108 of the data converter of FIG. 1 in accordance with one embodiment. In the embodiment shown, DAC 108 comprises an array of binary weighted DAC elements (e.g. capacitors) 202-216. Alternate embodiments may use any type of charge redistribution array for data conversion in addition to or instead of capacitors, such as a voltage source, a current source, a selectable comparator offset, and an offset control circuit.

In addition, alternate embodiments may use any desired and appropriate binary weighted elements to provide conversion values (e.g. resistive elements, capacitive elements, a combination thereof, etc.). In the example shown, DAC elements 202-216 are capacitors coupled in parallel to one another. DAC elements 202, 204, 206, 210, 212, 214 correspond to respective bits. DAC element 206 can be used to set an offset for DAC elements 202-204, and can also be used if there is an overflow condition with the available bits during the conversion process.

In the example shown, DAC element 202 corresponds to Bit N−1, where N is the resolution of the ADC. DAC element 204 corresponds to Bit M and can be separated from DAC element 202 by any suitable number of DAC elements. DAC element 206 can be used as an offset during the processing of most significant Bits N−1 through M+1 and for overflow conditions, as required. DAC element 208 corresponds to Bit M−1. DAC element 210 can be separated from DAC element 208 by any suitable number of DAC elements and corresponds to Bit L. DAC element 212 corresponds to Bit L−1. DAC element 214 can be separated from DAC element 212 by any suitable number of DAC elements and corresponds to Bit 0. DAC element 216 is a termination element that is typically not used during the conversion. For less significant bits below Bit M, a DAC element associated with a bit that is less significant than the bits being converted can be used to provide an offset value. For example, if DAC element 206 is used to provide an offset during the conversion of Bits N−1 through Bit M+1, then DAC element 212 can be used to provide an offset during the conversion of Bit M through Bit L.

Comparator 110 is provided with a constant reference voltage by binary weighted DAC elements 218-224 during a conversion. DAC elements 218-224 are shown as capacitors coupled in parallel between a reference voltage VRL and a non-inverting input to comparator 110.

A first terminal of a first switch 252 is coupled to the output of DAC elements 218-224 and a non-inverting input to comparator 110. A first terminal of a second switch 254 is coupled to the output of DAC elements 202-216 and an inverting input to comparator 110. A second terminal of switch 252 is coupled to a second terminal of switch 254.

During a sample phase, switches 252 and 254 are placed in conducting mode to short the inputs to comparator 110 to a common mode voltage VCM. A voltage input VI is sampled onto the array of DAC elements 202-204, 208-216. Then during an approximation phase, switches 252 and 254 are placed in non-conducting mode and the DAC elements 202-214 are controlled to successively approximate the input voltage VI using the comparator 110 output to make decisions on how to switch the DAC elements 202-214. At each step of the approximation, the comparator 110 output is stored in the SAR register 106 and the resulting digital word is the digital representation of the analog input voltage VI.

A bottom plate of each DAC element 202-216 is coupled to a respective switch array 226-240 to control the voltage applied to DAC elements 202-216. Each switch array 226-240 includes three switches 242-246 (as labeled for switch array 226). Switch 242 is coupled to a low voltage VL, switch 244 is coupled to a high voltage (VH) and switch 246 is coupled to the input voltage (VI). During the sample phase, switch 246 is set to conducting mode to apply the input voltage to the bottom plates of DAC elements 202-204, 208-216 and switches 242-244 are in non-conducting mode. During the approximation phase, switch 246 is non-conducting, and either switch 242 or 244 will be in conducting mode depending on whether the particular bit is required to represent the input voltage.

In the portion of DAC 108 illustrated in FIG. 2, there are two scaling capacitors 248 and 250 that are used to reduce the number of DAC elements 202-214 required to represent the input. Capacitor 250 scales the voltage for DAC elements 208-216 by a first factor of $2^{(M-L)}$. Capacitor 252 again scales the voltage for DAC elements 212-216 by a second factor of $2^L$. Although the portion of data converter 108 illustrated in FIG. 2 has two scaling capacitors 248, 250, alternate embodiments may have any number of scaling capacitors. For example, by using scaling capacitors 248, 250 in a 12 bit data converter 108, only 48 DAC elements 202-204, 208-216, 218-224, 248-250 are required to represent the input voltage plus one DAC element 206 to allow redundancy. For a traditional 12-bit data converter, 4096 DAC elements would be required to represent the input voltage plus additional DAC elements to provide redundancy.

Figure 3:
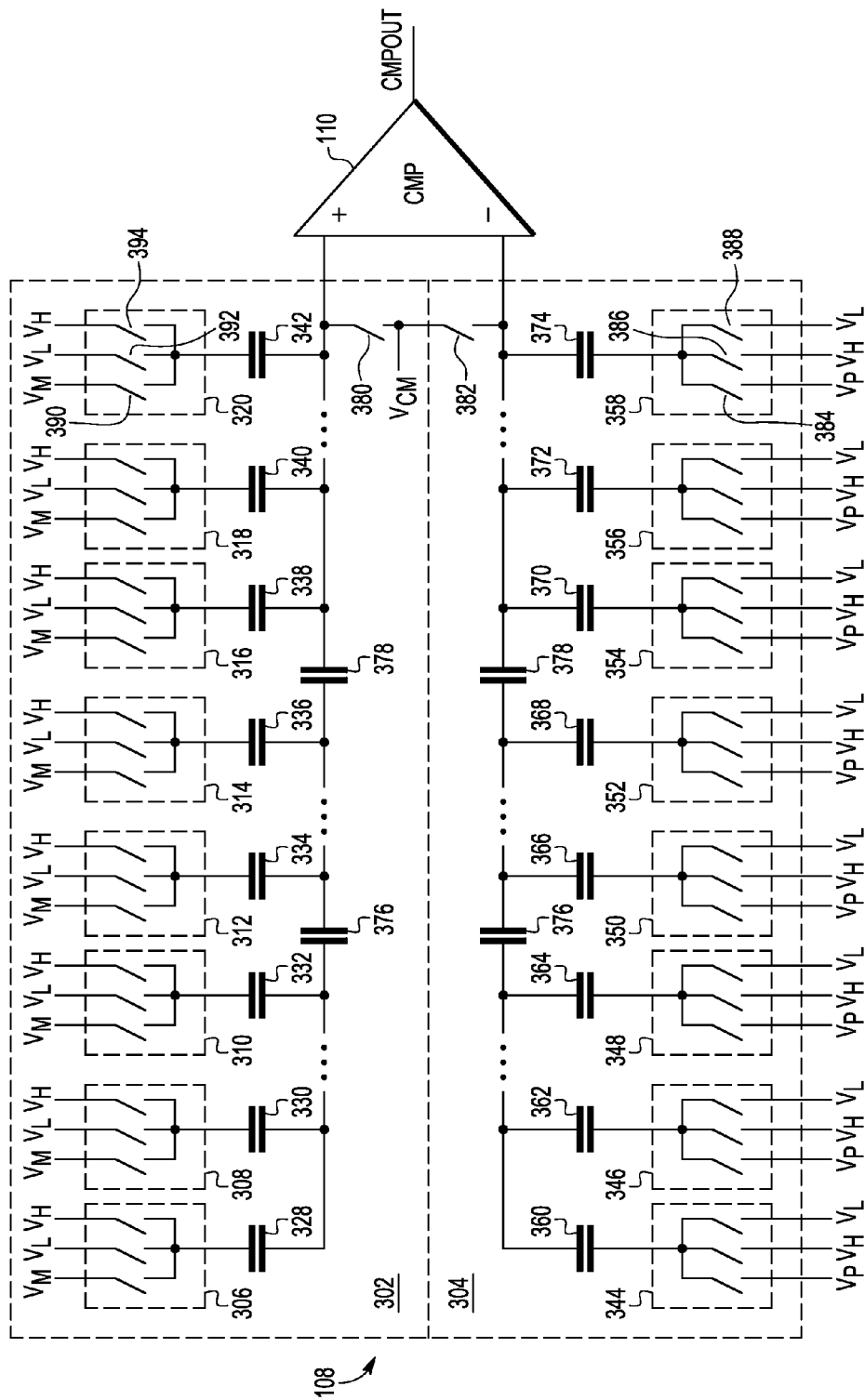
FIG. 3 illustrates, in schematic diagram form, a portion of a differential digital to analog converter of the data converter of FIG. 1 in accordance with another embodiment.

FIG. 3 illustrates, in schematic diagram form, a portion of a differential digital to analog converter 108 of the data converter 100 of FIG. 1 in accordance with another embodiment. In the embodiment shown, DAC 108 comprises a first array of binary weighted DAC elements (e.g. capacitors) 360-374 on a plus side 304 of DAC 108 and a second array of binary weighted DAC elements (e.g. capacitors) 328-341 on a minus side 302 of DAC 108. Alternate embodiments may use any type of charge redistribution array for data conversion. In addition, alternate embodiments may use any desired and appropriate binary weighted elements (e.g. resistive elements, capacitive elements, a combination thereof, etc.). In the example shown, DAC elements 360-374 and 328-341 are capacitors coupled in parallel to one another. DAC elements 362-374 and 341-330 correspond to respective bits. DAC elements 338 and 370 can be used to set an offset while performing successive approximation using respective DAC elements 340-341 and 372-374, and can also be used if there is an overflow condition with the available bits during the conversion process.

In the example shown, for the minus side 302 and the plus side 304, DAC elements 341, 374 correspond to respective Bits N−1. DAC elements 340, 372 correspond to respective Bits M and can be separated from corresponding DAC element 341, 374 by any suitable number of DAC elements. DAC elements 338, 370 can be used as an offset during the processing of most significant Bits N−1 through M+1 and for overflow conditions in the minus side 302 and plus side 304 successive approximation results, as required. DAC elements 336, 368 correspond to respective Bits M−1. DAC elements 334, 366 can be separated from respective DAC elements 336, 368 by any suitable number of DAC elements and correspond to respective Bits L. DAC elements 332, 364 correspond to respective Bits L−1. DAC elements 330, 362 can be separated from respective DAC elements 332, 364 by any suitable number of DAC elements and correspond to Bits 0, the least significant bits. DAC elements 328, 360 are termination elements that are typically not used during the conversion. For less significant bits below Bits M, a DAC element associated with a bit that is less significant than the bits being converted can be used to provide an offset value. For example, if DAC elements 338, 370 are used to provide an offset during the conversion of respective Bits N−1 through Bits M+1, then DAC elements 332, 364 can be used to provide an offset during the conversion of respective Bits M through Bits L.

A first terminal of a first switch 380 is coupled to the output of DAC elements 328-341 and a non-inverting input to comparator 110. A first terminal of a second switch 382 is coupled to the output of DAC elements 360-374 and an inverting input to comparator 110. A second terminal of switch 380 is coupled to a second terminal of switch 382 at a common voltage node VCM.

During a sample phase, switches 380 and 382 are placed in conducting mode to short the inputs to comparator 110 to the common mode voltage VCM. A plus-side input voltage VP is sampled onto the array of DAC elements 360-368, 372-374 and a minus side input voltage VM is sampled on the array of DAC elements 328-336, 340-341. Then during an approximation phase, switches 380 and 382 are placed in non-conducting mode and the DAC elements 362-374, 328-341 are controlled to successively approximate the plus-side input voltage VP and minus side input voltage VM using the comparator 110 output to make decisions on how to switch the DAC elements 362-374 and 328-341. At each step of the approximation, the comparator 110 output is stored in the SAR register 106 and the resulting digital word is the digital representation of the difference between the analog plus-side input voltage VP and minus side input voltage VM.

A bottom plate of each DAC element 328-341, 360-374 is coupled to a respective switch array 306-320, 344-358 to control the voltage applied to DAC elements 328-341, 360-374. Each switch array 306-320, 344-358 includes three respective switches 390-394, 384-388 (as labeled for switch arrays 320 and 358). Switches 392, 388 are coupled to a low voltage VL, switches 394, 386 are coupled to a high voltage (VH) and switches 390, 384 are coupled to the minus-side input voltage VM and plus-side input voltage VP, respectively. During the sample phase, switches 390, 384 are set to conducting mode to apply the input voltage to the bottom plates of DAC elements 328-336, 340-341, 360-368, 372-374 and switches 392-394, 386-388 are in non-conducting mode. During the approximation phase, switches 390, 384 are non-conducting, and either switches 392 or 394, and 388 or 386 will be in conducting mode depending on whether the particular bit is required to represent the respective differential input voltage.

In the portion of DAC 108 illustrated in FIG. 3, scaling capacitors 342-343 and 376-378 are used to reduce the number of DAC elements 328-341, 362-374 required to represent the input voltages. Capacitors 343 and 378 scale the voltages for respective DAC elements 328-346, 360-368 by a first factor of $2^{(M-L)}$. Capacitors 342, 376 again scale the voltages for respective DAC elements 328-332 and 360-364 by a second factor of $2^L$. Although the portion of data converter 108 illustrated in FIG. 3 has four scaling capacitors 342, 343, 376, 378, alternate embodiments may have any number of scaling capacitors. For example, by using scaling capacitors 342, 343, 376, 378 in a 12 bit data converter 108, only ninety-six DAC elements 328-336, 340-343, 360-368, 372-378 are required to represent the differential input voltage plus two DAC elements 338, 370 to allow redundancy. For a traditional 12-bit differential data converter, 8192 DAC elements would be required to represent the differential input voltage plus additional DAC elements to allow redundancy.

Figure 4:
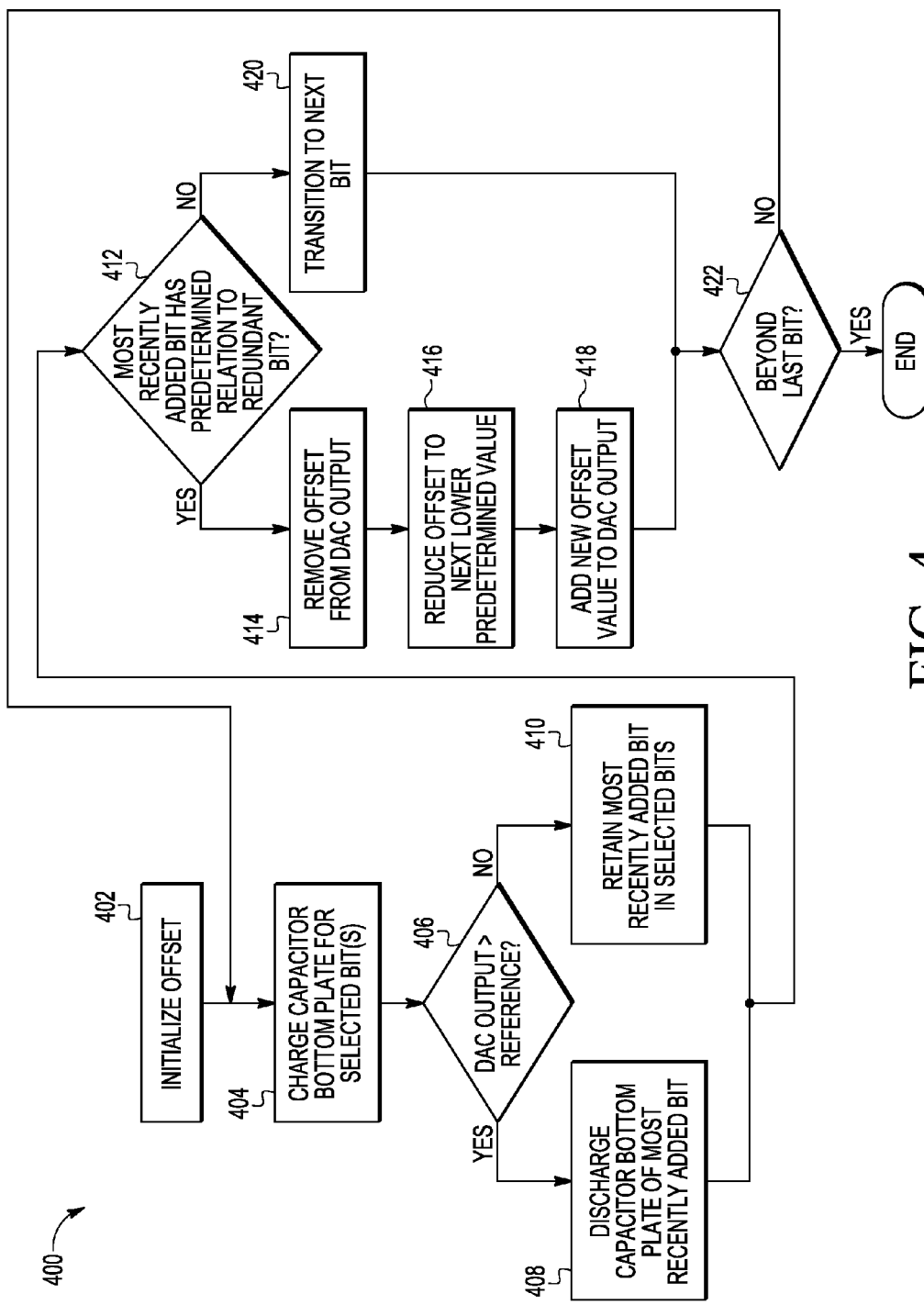
FIG. 4 illustrates, in flow diagram form, a method for adding offset to comparison bits at predetermined points in the DAC of FIG. 2.

Referring to FIGS. 2 and 4, FIG. 4 illustrates, in flow diagram form, a method 400 for adding offset to comparison bits at predetermined points in the DAC 108 of FIG. 2. Process 402 includes initializing an offset value to a first value for the approximation phase using a predetermined set of DAC elements, where capacitors are used for the DAC elements. For example, for DAC elements 202-206 in FIG. 2, DAC element 208 can be used to create an offset that is one-half the value of the lowest bit weight in the group of DAC elements 202-204. If DAC 108 is a 12-bit DAC with little endian architecture, and DAC element 204 corresponds to Bit 8 (with DAC element 202 corresponding to Bit 11), the weight of DAC element 204 would be 256 and DAC element 208 could be used to provide an offset value of 128 while DAC elements 202-206 are being converted. Other suitable offset values can be used.

Process 404 includes charging the bottom plates of capacitors for selected DAC elements. DAC elements are added in one by one during the approximation phase. For example, DAC element 202 is initially selected, and then DAC element 204 (assuming no intervening DAC elements between DAC elements 202 and 204), and then DAC element 206, and so on. DAC element 208 can be used to provide an offset while DAC elements 202-206 are being selected for successive approximation.

Process 406 includes using comparator 110 to determine whether the output of the selected DAC elements is greater than the reference voltage. If so, process 408 includes discharging the bottom plate of the capacitor corresponding to the bit most recently added to or included in the approximation. If the output value of the selected DAC elements is less than or equal to the reference voltage, process 410 retains the most recently added bit in the approximation. That is, the bottom plate of the corresponding capacitor is not discharged.

After performing process 408 or 410, process 412 determines whether the most recently added bit (whether retained in the approximation or not) has a predetermined relationship to the bit or DAC element being used to add the offset, referred to as the redundant bit. For example, in some embodiments, if the bit used for the offset is directly after the most recently added bit, then the bit used for the offset meets the criteria for having a predetermined relationship to the most recently added bit and process 412 transitions to process 414 to remove the offset from the output of the DAC elements.

After process 414, process 416 reduces the offset value to a next lower predetermined value. For example, for the DAC 108 shown in FIG. 2, Bit 4 may be used to supply an offset during the successive approximation on Bits 5-7, and the value of the next offset can be set to a value that is one-half the value of the lowest bit weight in the group of Bits 5-7. For a 12-bit DAC, the weight of Bit 5 would be 32 and the value of the offset would be 16. Other suitable values can be used for the offset, however. After process 416, process 418 adds the new offset value to the DAC output. If the path of processes 414-418 was chosen, there is no transition to the next bit and the same bit value is used for the next sequence of method 400.

Referring again to process 412, if the most recently added bit does not have a predetermined relationship to the redundant bit, process 420 transitions to the next bit, if any, in order. After process 418 or 420 are executed, process 422 determines whether the last bit in the DAC word has been previously selected, that is, if the next bit is beyond the number of bits included in the DAC word. If so, process 422 ends method 400. If not, process 422 transitions back to process 404.

Figure 5:
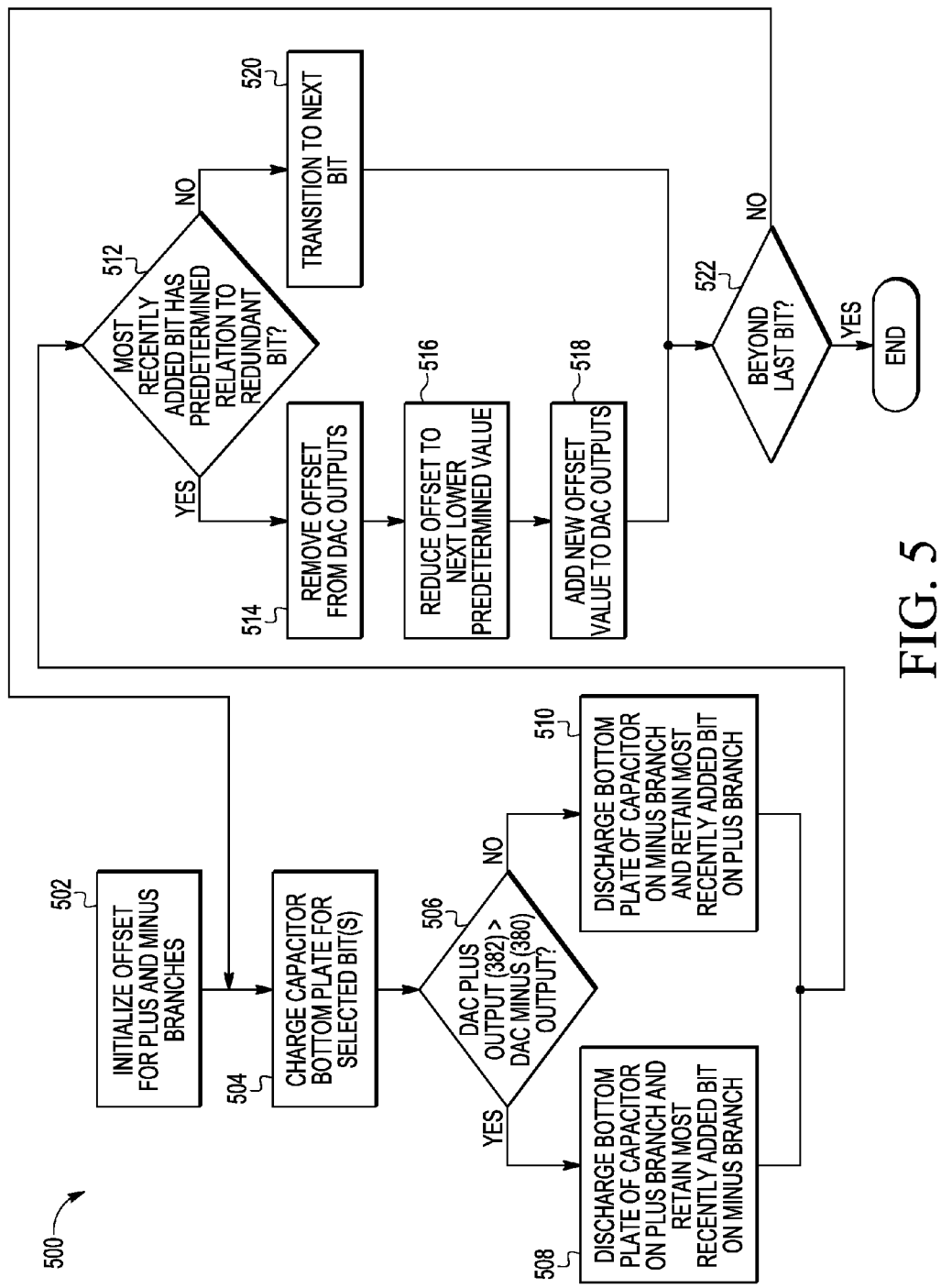
FIG. 5 illustrates, in flow diagram form, a method for adding offset to comparison bits at predetermined points in the DAC of FIG. 3.

Referring to FIGS. 2 and 5, FIG. 5 illustrates, in flow diagram form, a method 500 for adding offset to comparison bits at predetermined points in the differential DAC 108 of FIG. 3. Process 502 includes initializing offset values for plus and minus branches 304, 302 to first values for the approximation phase using a predetermined set of DAC elements, where capacitors are used for the DAC elements. For example, for DAC elements 338-341, 370-374 in FIG. 3, respective DAC elements 314, 368 can be initialized to a value that is one-half the value of the lowest bit weight in the group of DAC elements 338-341, 370-374. If DAC 108 is a 12-bit DAC with little endian architecture, and DAC elements 314, 368 correspond to Bit 7 (with DAC elements 341, 374 corresponding to Bit 11), the weight of DAC elements 314, 368 would be 128 and DAC elements 314, 368 could be used to provide an offset value of 128 during the portion of the approximation that uses DAC elements 338-341, 370-374. Other suitable offset values can be used.

Process 504 includes charging the bottom plates of capacitors for selected bits or DAC elements. DAC elements are added in one by one during the approximation phase. For example, DAC elements 341, 374 are initially selected, and then DAC elements 340 and 372, (assuming no intervening DAC elements between DAC elements 341 and 340, and between DAC elements 374 and 372), and then DAC element 338 (minus side 302) and DAC element 370 (plus side 304), and so on. DAC elements 336, 368 can be used to provide respective offsets.

Process 506 includes using comparator 110 to determine whether the output of the selected DAC elements on the plus side 304 is greater than the DAC output on the minus side 302. If so, process 508 includes discharging the bottom plate of the capacitor corresponding to the bit most recently added to or included in the approximation on the plus side 304 and retaining the most recently bit in the minus side 302. If the output of the selected DAC elements on the plus side 304 is less than or equal to the DAC output on the minus side 302, process 510 includes discharging the bottom plate of the capacitor corresponding to the bit most recently added to or included in the approximation on the minus side 302 and retaining the most recently bit in the plus side 304.

After performing process 508 or 510, process 512 determines whether the most recently added bit (whether retained in the approximation or not) has a predetermined relationship to the bit or DAC element being used to add the offset, referred to as the redundant bit. For example, in some embodiments, if the bit used for the offset is directly after the most recently added bit, then the bit used for the offset meets the criteria for having a predetermined relationship to the most recently added bit and process 512 transitions to process 514 to remove the offset from the output of the DAC elements on the plus side 304 and the minus side 302.

After process 514, process 516 reduces the offset value to a next lower predetermined value. For example, for the DAC 108 shown in FIG. 3, Bit 4 may be used to supply an offset during the successive approximation on Bits 5-7, and the value of the next offset can be set to a value that is one-half the value of the lowest bit weight in the group of Bits 5-7. For a 12-bit DAC, the weight of Bit 5 would be 32 and the value of the offset would be 16. Other suitable values can be used for the offset, however. After process 516, process 518 adds the new offset value to the DAC output. If the path of processes 514-518 was chosen, there is no transition to the next bit since the same bit value is used for the next sequence of method 500.

Referring again to process 512, if the most recently added bit does not have a predetermined relationship to the redundant bit, process 520 transitions to the next bit, if any, in order. After process 518 or 520 are executed, process 522 determines whether the last bit in the DAC word has been previously selected, that is, if the next bit is beyond the number of bits included in the DAC word. If so, process 522 ends method 500. If not, process 522 transitions back to process 504.

By now it should be appreciated that there has been provided a data converter 100 that uses existing components to provide redundancy and improve accuracy while speeding up operation. Errors are corrected during a DAC approximation phase without requiring complicated result translations, ROM arrays, or lookup tables and without altering a standard binary DAC structure beyond having one additional element to handle overflow.

In some embodiments, a system for converting an analog signal to a digital signal can comprise a redundancy element [370] operable to provide an offset range, and a comparator [110] coupled to a digital-to-analog converter (DAC). The comparator is operable to compare a reference to an output associated with the DAC. A control circuit [102] is coupled to the redundancy element and is operable to, for a first bit value, communicate a first conversion value to the DAC [108] including a first offset [404] associated with a first offset bit value [402]. In response to a first comparison result [406] from the comparator, a second conversion value [408, 410] is set. If the first bit value has a predetermined relationship to the first offset bit value [412], the first offset is removed from the second conversion value [414]. In response to a second comparison result [406, second time] from the comparator, a third conversion value [408, 410, second time] is set.

In another aspect, the control circuit can be further operable to transition to a second bit value [420] in response to the second comparison result.

In another aspect, the control circuit can be further operable to, for the second bit value, communicate a fourth conversion value to a digital-to-analog converter (DAC) [108]. The fourth conversion value can include a first offset [404], the first offset associated with a first offset bit value [402]. In response to a third comparison result [406] from the comparator, a fifth conversion value [408, 410] can be set. If the first bit value has a predetermined relationship to the first offset bit value [412], the first offset can be removed from the fifth conversion value [414]. In response to a fourth comparison result [406, second time] from the comparator, a sixth conversion value [408, 410, second time] can be set.

In another aspect, the control circuit can be further operable to set a seventh conversion value [418] in response to the second comparison result. The seventh conversion value can include a second offset [416], and the second offset can be associated with a second offset bit value.

In another aspect, the second offset can be less than the first offset.

In another aspect, the can be is a single-ended DAC [FIG. 2].

In another aspect, the DAC can be a differential DAC [FIG. 3].

In another aspect, each of the conversion values can comprise a pair of related conversion values [FIGS. 3, 5].

In another aspect, the control circuit can operate at a fixed clock rate.

In another aspect, the redundancy element can be selected from the group consisting of: a capacitor, a voltage source, a current source, a selectable comparator offset, and an offset control circuit.

In another aspect, the redundancy element can be part of the DAC.

In another aspect, the redundancy element can be part of the comparator.

In another aspect, the system can further comprise a register [106] coupled to the control circuit. The register can be operable to temporarily store the conversion values for access by the DAC.

In another aspect, the reference can be an output of the differential DAC.

In another aspect, the predetermined relationship can comprise the first bit value being one greater than the first offset bit value.

In other embodiments, a method for electronically converting an analog signal to a digital signal can comprise, for a first bit value, setting a first conversion value [404] to include a first offset [402], the first offset associated with a first offset bit value and using the output of a first comparison [406], setting a second conversion value [408, 410]. If the first bit value has a predetermined relationship to the first offset bit value [412], the first offset can be removed from the second conversion value [414]. The output of a second comparison [406, second time] can be used to set a third conversion value [408, 410, second time].

In another aspect, the method can further comprise, after using the output of the second comparison, transitioning to a second bit value [420] and repeating the steps of the method for the second bit value.

In another aspect, the method can further comprise, prior to using the output of the second comparison, setting a fourth conversion value [418] to include a second offset [416], the second offset associated with a second offset bit value.

In another aspect, the second offset can be less than the first offset.

In another aspect, setting the first conversion value can comprises charging a bottom plate of a capacitor associated with the first bit value.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Some of the above embodiments, as applicable, may be implemented using a variety of different information processing systems. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. For example, any one or more of the features described herein may be used in any desired and appropriate combination with any other features. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system for converting an analog signal to a digital signal, the system comprising:
   a redundancy element operable to provide an offset range;
   a comparator coupled to a digital-to-analog converter (DAC), the comparator operable to compare a reference to an output associated with the DAC;
   a control circuit coupled to the redundancy element, the control circuit operable to, for a first bit value:
      communicate a first conversion value to the DAC, the first conversion value including a first offset, the first offset associated with a first offset bit value;
      in response to a first comparison result from the comparator, setting a second conversion value; and
      if the first bit value has a predetermined relationship to the first offset bit value, remove the first offset from the second conversion value; and
         in response to a second comparison result from the comparator, setting a third conversion value.

2. The system of claim 1, wherein the control circuit is further operable to transition to a second bit value in response to the second comparison result.

3. The system of claim 2, wherein the control circuit is further operable to, for the second bit value:
   communicate a fourth conversion value to a digital-to-analog converter (DAC), the fourth conversion value including a first offset, the first offset associated with a first offset bit value;
   in response to a third comparison result from the comparator, setting a fifth conversion value; and
   if the first bit value has a predetermined relationship to the first offset bit value, remove the first offset from the fifth conversion value; and
   in response to a fourth comparison result from the comparator, setting a sixth conversion value.

4. The system of claim 3, wherein the control circuit is further operable to set a seventh conversion value in response to the second comparison result, the seventh conversion value including a second offset, and the second offset associated with a second offset bit value.

5. The system of claim 4, wherein the second offset is less than the first offset.

6. The system of claim 1, wherein the DAC is a single-ended DAC.

7. The system of claim 1, wherein the DAC is a differential DAC.

8. The system of claim 7, wherein each of the conversion values comprises a pair of related conversion values.

9. The system of claim 1, wherein the control circuit operates at a fixed clock rate.

10. The system of claim 1, wherein the redundancy element is selected from the group consisting of: a capacitor, a voltage source, a current source, a selectable comparator offset, and an offset control circuit.

11. The system of claim 1, wherein the redundancy element is part of the DAC.

12. The system of claim 1, wherein the redundancy element is part of the comparator.

13. The system of claim 1, further comprising a register coupled to the control circuit, the register operable to temporarily store the conversion values for access by the DAC.

14. The system of claim 7, wherein the reference is an output of the differential DAC.

15. The system of claim 1, wherein the predetermined relationship comprises the first bit value being one greater than the first offset bit value.

16. A method for electronically converting an analog signal to a digital signal, the method comprising:
for a first bit value, setting a first conversion value to include a first offset, the first offset associated with a first offset bit value;
using the output of a first comparison, setting a second conversion value; and
if the first bit value has a predetermined relationship to the first offset bit value, removing the first offset from the second conversion value; and
using the output of a second comparison, setting a third conversion value,
wherein setting the first conversion value comprises charging a bottom plate of a capacitor associated with the first bit value.

17. The method of claim 16, further comprising after using the output of the second comparison, transitioning to a second bit value and repeating the steps of the method for the second bit value.

18. The method of claim 16, further comprising, prior to using the output of the second comparison, setting a fourth conversion value to include a second offset, the second offset associated with a second offset bit value.

19. The method of claim 18, wherein the second offset is less than the first offset.

* * * * *